(12) United States Patent
Choi et al.

(10) Patent No.: US 8,314,387 B2
(45) Date of Patent: Nov. 20, 2012

(54) SCANNING ELECTRON MICROSCOPE

(75) Inventors: Chang Hoon Choi, Suwon (KR);
Vyacheslav Vasil'evich Kazmiruk, Moscow region (RU); Mikhail Yur'evich Barabanenkov, Moscow region (RU); Dmitry Vladimirovich Tsisar, Niznegorodskaya oblast (RU)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 42 days.

(21) Appl. No.: 12/926,726

(22) Filed: Dec. 7, 2010

(65) Prior Publication Data
US 2011/0133082 A1  Jun. 9, 2011

(30) Foreign Application Priority Data
Dec. 9, 2009  (RU) .............................. 2009145477
Nov. 24, 2010  (KR) ......................... 10-2010-117425

(51) Int. Cl.
*G01N 23/00* (2006.01)

(52) U.S. Cl. ......... 250/310; 250/306; 250/307; 250/311

(58) Field of Classification Search .................. 250/306, 250/307, 310, 311
See application file for complete search history.

(56) References Cited

U.S. PATENT DOCUMENTS

| 4,177,379 A * | 12/1979 | Furukawa et al. ............ 250/306 |
| 2004/0245465 A1* | 12/2004 | Steigerwald et al. ......... 250/310 |
| 2005/0104000 A1* | 5/2005 | Kindem et al. ............ 250/361 R |
| 2008/0315094 A1* | 12/2008 | Wang et al. .................. 250/310 |
| 2009/0090866 A1* | 4/2009 | Zhang et al. ............. 250/361 R |
| 2009/0309024 A1* | 12/2009 | Steigerwald et al. ......... 250/310 |
| 2010/0140471 A1* | 6/2010 | Kazumori ..................... 250/307 |

* cited by examiner

*Primary Examiner* — Michael Maskell
(74) *Attorney, Agent, or Firm* — Harness, Dickey & Pierce, P.L.C.

(57) ABSTRACT

Example embodiments are directed to a scanning electron microscope. The scanning electron microscope includes an electron gun to configured irradiate an electron beam on a sample, and a disc of a transparent material and including a through-hole through which the electron beam passes. The disc includes a scintillator layer formed at a surface thereof so as to generate photons based on the secondary electrons received from the sample. A reflecting layer is formed at an inner peripheral surface of the through-hole so as to reflect the photons, thereby preventing leakage of the photons via the through-hole.

6 Claims, 2 Drawing Sheets

SCANNING ELECTRON MICROSCOPE

CROSS-REFERENCE TO RELATED APPLICATION

This application priority under 35 U.S.C. §119 to Russian Patent Application No. 2009145477 filed on Dec. 9, 2009 and Korean Patent Application No. 10-2010-0117425 filed on Nov. 24, 2010 in the Korean Intellectual Property Office, the entire disclosure of both these applications is incorporated herein by reference.

BACKGROUND

1. Field

Example embodiments relate to a scanning electron microscope having a disc that collects photons generated in a scintillator layer.

2. Description of the Related Art

A scanning electron microscope is an apparatus which scans a sample to be inspected using an electron beam, thereby obtaining a two-dimensional (2D) scanning image representing, for example, the surface of the sample.

The scanning electron microscope includes an electron gun to irradiate an electron beam on a sample, an objective lens to focus the electron beam on the sample, and/or a secondary electron detector to receive and detect secondary electrons generated in the objective lens.

The secondary electron detector includes a disc having a scintillator layer to generate photons upon receiving secondary electrons, a light guide disposed at a radially outward position of the disc so as to guide the photons generated in the scintillator layer in a radially outward direction, and a photon amplification tube to amplify the photons, having passed through the light guide, into electrical signals.

However, conventional scanning electron microscopes may be relatively inefficient in that the secondary electrons received may leak to the outside of the disc through a through-hole of the disc.

SUMMARY

According to example embodiments, a scanning electron microscope includes an electron gun configured to irradiate an electron beam on a sample; and a disc of a transparent material including a through-hole through which the electron beam passes, the disc further including a scintillator layer on a surface thereof, the scintillator layer configured to generate photons based on secondary electrons received from the sample, wherein the though-hole includes, at an inner peripheral surface thereof, a reflecting layer configured to reflect the received photons.

According to example embodiments, the inner peripheral surface of the through-hole is tapered and has a gradually decreasing diameter in a direction of travel of the irradiated electron beam.

According to example embodiments, the disc further includes a grating layer at the outside of the scintillator layer.

According to example embodiments, the disc further includes a protective layer between the scintillator layer and the grating layer, the protective layer configured to prevent generation of static electricity.

According to example embodiments, surfaces of the disc are in a convex shape.

According to example embodiments, the microscope further includes a photon amplification tube at a position that is radially outward of the disc; and a light guide between the disc and the photon amplification tube, the light guide configured to guide the photons collected in the disc to the photon amplification tube.

According to example embodiments, a cross section of the through-hole includes the opposite lateral edges of the through-hole at about 90 degrees with each other.

According to example embodiments, a scanning electron microscope including an electron gun configured to irradiate an electron beam on a sample; an objective lens configured to focus the electron beam on the sample; and a secondary electron detector configured to detect secondary electrons generated in the sample, wherein the secondary electron detector includes a disc of a transparent material, the disc having convex surfaces and including a through-hole through which the electron beam passes, the through-hole being tapered and having a gradually decreasing diameter in a direction of travel of the irradiated electron beam, a photon amplification tube at a position radially outward of the disc and configured to detect photons, and a light guide configured to guide the photons from the disc to the photon amplification tube, and wherein the disc includes a scintillator layer formed at a surface thereof and facing the sample, the scintillator layer configured to generate photons based on the secondary electrons received from the sample, and a reflecting layer at an inner peripheral surface of the through-hole, the reflecting layer configured to reflect the generated photons.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
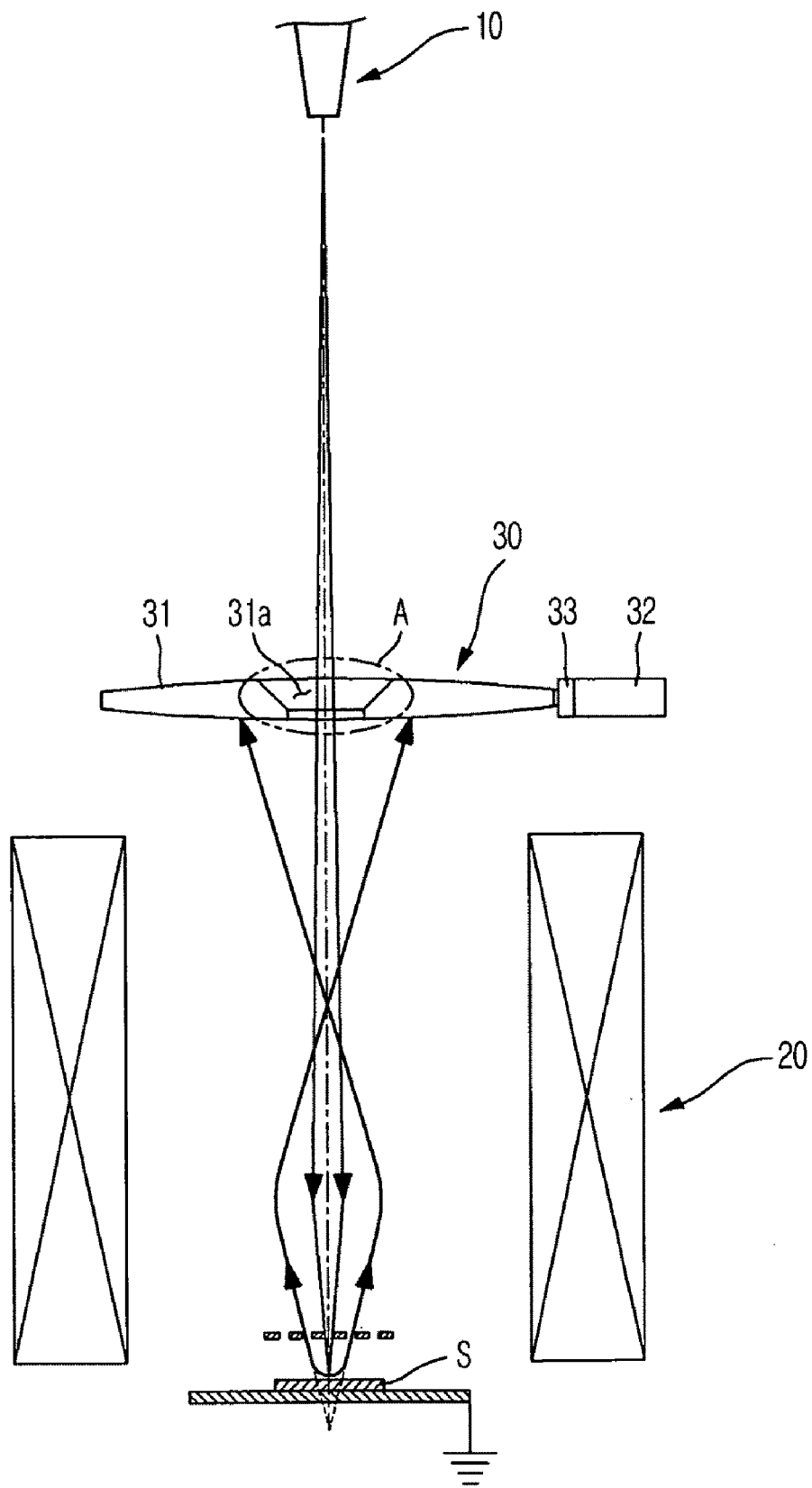
FIG. 1 illustrates a scanning electron microscope according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

As illustrated in FIG. 1, a scanning electron microscope includes an electron gun 10 to generate and irradiate an electron beam on a sample S to be inspected, an objective lens 20 in a form of a coil to focus the electron beam on the sample S, and a secondary electron detector 30 to detect secondary electrons generated in the sample S when the electron beam is irradiated on the sample S.

The secondary electron detector 30 includes a disc 31, a photo amplification tube 32, and a light guide 33. The disc 31 has a center through-hole 31a for passage of the electron beam irradiated from the electron gun 10. The disc 31 serves to generate photons upon receiving the secondary electrons. The photon amplification tube 32 is disposed at a radially outward position of the disc 31 and detects the photons generated in the disc 31. The light guide 33 is disposed between the disc 31 and the photon amplification tube 32 and guides the photons transmitted in a radially outward direction in the disc 31 to the photon amplification tube 32. Although illustrated on one side of the disc 31 in FIG. 1, the location of the photo amplification tube 32 and the light guide 33 is not limited to the position illustrated in FIG. 1.

Figure 2:
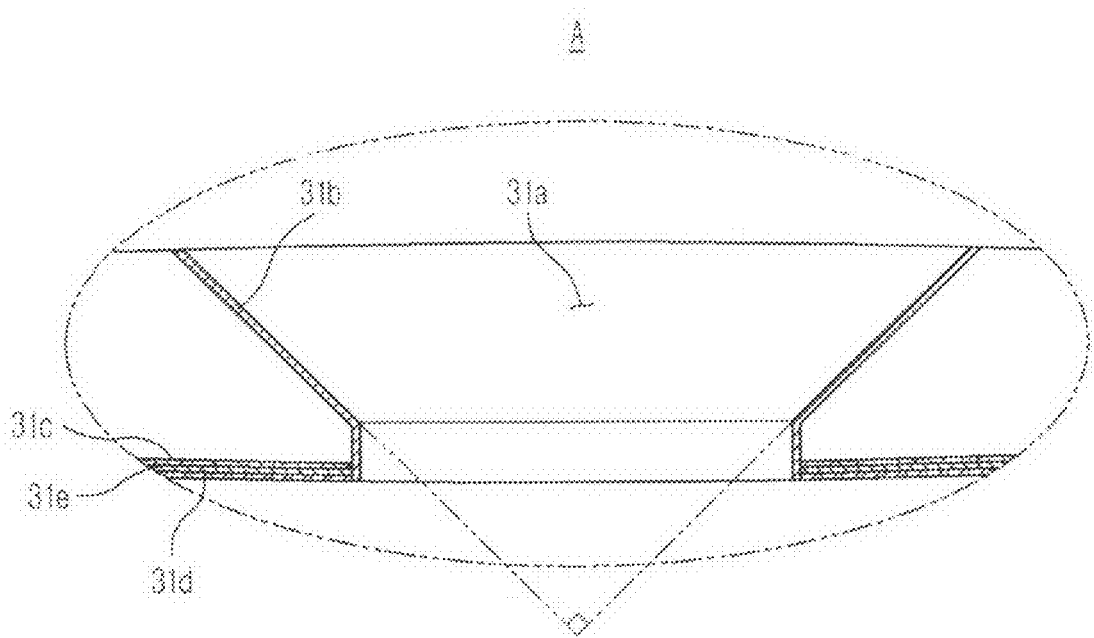
FIG. 2 is an enlarged view of the portion A of FIG. 1, according to example embodiments.

The disc 31, as illustrated in FIG. 2, includes a scintillator layer 31c to generate photons upon receiving the secondary electrons transmitted from the sample S. The scintillator layer 31c is formed on a surface of the disc 31 facing the sample S. The disc 31 is made of a transparent material to enable passage of the photons generated in the scintillator layer 31c.

The photons generated in the scintillator layer 31c radiate, for example, isotropically. Thus, the photons radiate outward as well as inward of the disc 31. To prevent the photons from radiating outward of the disc 31, a grating layer 31d is formed on the outside of the scintillator layer 31c. The grating layer 31d allows the secondary electrons generated in the sample S to reach the scintillator layer 31c therethrough, but prevents the photons generated in the scintillator layer 31c from radiating outward of the disc 31.

A protective layer 31e is disposed between the scintillator layer 31c and the grating layer 31c to prevent generation of static electricity. The protective layer 31e is made of a material to enable passage of electrons, allowing the electrons to be transmitted to the scintillator layer 31c.

As described above, the disc 31 guides the photons generated in the scintillator layer 31c in a radially outward direction and the light guide 33 transmits the photons to the photon amplification tube 32. To more efficiently guide the photons generated in the scintillator layer 31c in a radially outward direction, both surfaces of the disc 31 may be formed in a convex shape like, for example, a convex lens.

A reflecting layer 31b is formed on an inner peripheral surface of the through-hole 31a. The reflecting layer 31b is made of a metal to prevent the photons generated in the scintillator layer 31c from leaking via the through-hole 31a of the disc 31.

Also, to allow the reflecting layer 31b to efficiently reflect the photons directed to the through-hole 31 in a radially outward direction of the disc 31, the inner peripheral surface of the through-hole 31a may be tapered, a diameter of which gradually decreases in the direction of the irradiated electron beam. Thus, the through-hole 31a has an approximately circular truncated cone form. In example embodiments, the through-hole 31a has a cross section, wherein opposite lateral edges of the through-hole 31a form an angle of 90 degrees between themselves.

When the inner peripheral surface of the through-hole 31a is tapered as described above, the reflecting layer 31b formed at the inner peripheral surface of the through-hole 31a may reflect the photons, directed from the scintillator layer 31c in the direction of the through-hole 31a, in an approximately radial direction of the disc 31, thereby allowing the photons to be more efficiently guided toward the light guide 33 and the photon amplification tube 32 located at radially outward position of the disc 31.

As is apparent from the above description, owing to a reflecting layer formed at an inner peripheral surface of a through-hole of a disc, it may be possible to prevent leakage of photons through the inner peripheral surface of the through-hole.

Further, as a result of including the inner peripheral surface of the through-hole with a tapered shape as described above, it may be possible to more efficiently guide photons in a radially outward direction of the disc.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A scanning electron microscope comprising:
   an electron gun configured to irradiate an electron beam on a sample; and
   a disc of a transparent material including a through-hole through which the electron beam passes, the disc further including
      a scintillator layer on a surface thereof, the scintillator layer configured to generate photons based on secondary electrons received from the sample,
      a grating layer on an outside of the scintillator layer, and
      a protective layer between the scintillator layer and the grating layer, the protective layer configured to prevent generation of static electricity, wherein the through-hole includes, at an inner peripheral surface thereof, a reflecting layer configured to reflect the received photons.

2. The microscope according to claim 1, wherein the inner peripheral surface of the through-hole is tapered and has a gradually decreasing diameter in a direction of travel of the irradiated electron beam.

3. The microscope according to claim 1, wherein surfaces of the disc are in a convex shape.

4. The microscope according to claim 1, further comprising:
- a photon amplification tube at a position that is radially outward of the disc; and
- a light guide between the disc and the photon amplification tube, the light guide configured to guide the photons collected in the disc to the photon amplification tube.

5. The microscope according to claim 2, wherein a cross section of the through-hole includes the opposite lateral edges of the through-hole at about 90 degrees with each other.

6. A scanning electron microscope comprising:
- an electron gun configured to irradiate an electron beam on a sample;
- an objective lens configured to focus the electron beam on the sample; and
- a secondary electron detector configured to detect secondary electrons generated in the sample, wherein the secondary electron detector includes
  - a disc of a transparent material, the disc having convex surfaces and including a through-hole through which the electron beam passes, the through-hole being tapered and having a gradually decreasing diameter in a direction of travel of the irradiated electron beam,
  - a photon amplification tube at a position radially outward of the disc and configured to detect photons, and
  - a light guide configured to guide the photons from the disc to the photon amplification tube, and
- wherein the disc includes
  - a scintillator layer formed at a surface thereof and facing the sample, the scintillator layer configured to generate photons based on the secondary electrons received from the sample,
  - a grating layer on an outside of the scintillator layer;
  - a protective layer between the scintillator layer and the grating layer, the protective layer configured to prevent generation of static electricity, and
  - a reflecting layer at an inner peripheral surface of the through-hole, the reflecting layer configured to reflect the generated photons.

* * * * *